(12) United States Patent
Dennison

(10) Patent No.: US 7,105,408 B2
(45) Date of Patent: Sep. 12, 2006

(54) PHASE CHANGE MEMORY WITH A SELECT DEVICE HAVING A BREAKDOWN LAYER

(75) Inventor: Charles H. Dennison, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/948,884

(22) Filed: Sep. 24, 2004

(65) Prior Publication Data

US 2006/0073655 A1    Apr. 6, 2006

(51) Int. Cl.
*H01L 21/336* (2006.01)
(52) U.S. Cl. .............................. 438/257; 257/3; 257/296
(58) Field of Classification Search ................ 438/257, 438/308, 314, 315; 257/3, 4, 209, 296, 298
See application file for complete search history.

(56) References Cited

U.S. PATENT DOCUMENTS

2004/0113192 A1* 6/2004 Wicker ........................ 257/298
2005/0077515 A1* 4/2005 Kostylev ..................... 257/52

OTHER PUBLICATIONS

Van Landingham, "Circuit Applications of Ovonic Switching Devices", IEEE Transactions on Electron Devices, vol. ED-20, No. 2, Feb. 1973.

* cited by examiner

*Primary Examiner*—Phuc T. Dang
(74) *Attorney, Agent, or Firm*—Trop, Pruner & Hu, P.C.

(57) ABSTRACT

A select device may have its threshold current reduced relative to the threshold current of a phase change memory element by providing within the select device a breakdown layer. Because the breakdown layer forms a breakdown filament along its length, the relative area between layers may be reduced, reducing the threshold current of the select device relative to that of the memory element. In addition, a stack may be formed with the select device over the memory element. The select device may be arranged so that the position of the breakdown filament may be moved inwardly relative to the etched edge to also reduce leakage current. In one embodiment, sidewall spacers may be formed on a portion of the select device.

36 Claims, 6 Drawing Sheets

US 7,105,408 B2

PHASE CHANGE MEMORY WITH A SELECT DEVICE HAVING A BREAKDOWN LAYER

BACKGROUND

This invention relates generally to phase change memory devices.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Figure 1:
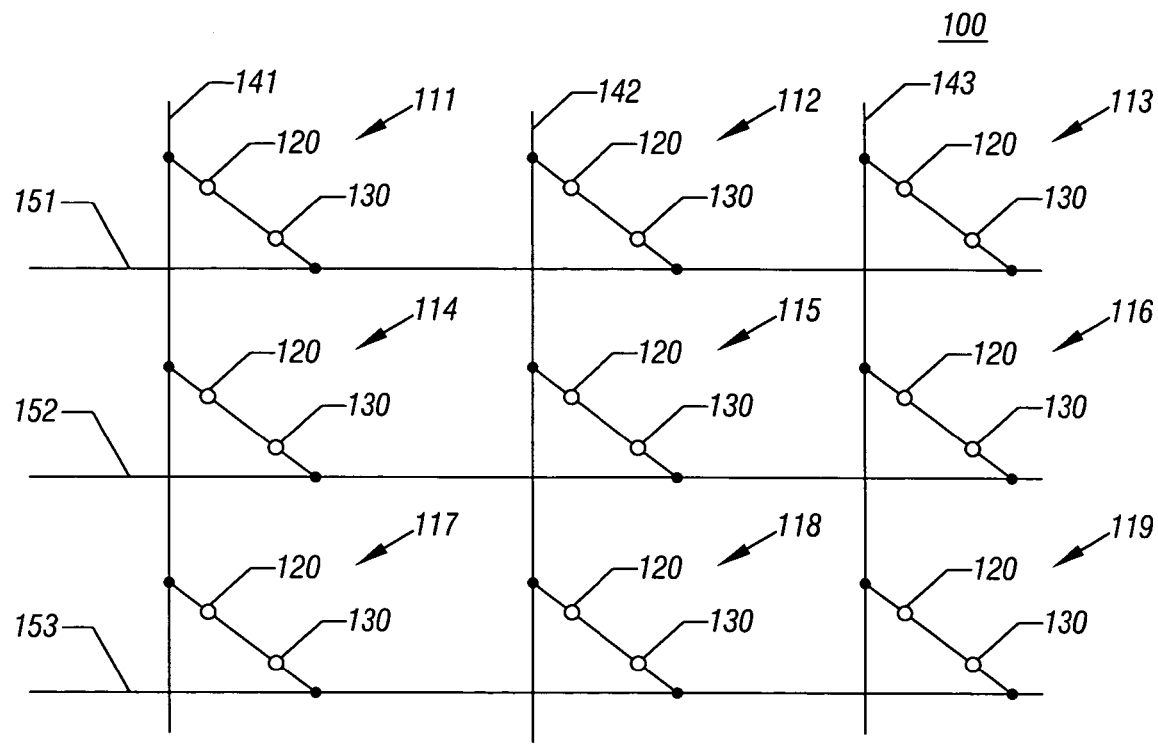
FIG. 1 is a schematic diagram illustrating a memory in accordance with one embodiment of the present invention.

Turning to FIG. 1, an embodiment of a memory 100 is illustrated. Memory 100 may include a 3×3 array of memory cells 111–119, wherein memory cells 111–119 each include a select device 120 and a memory element 130. Although a 3×3 array is illustrated in FIG. 1, the scope of the present invention is not limited in this respect. Memory 100 may have a larger array of memory cells.

In one embodiment, memory elements 130 may comprise a phase change material. In this embodiment, memory 100 may be referred to as a phase change memory. A phase change material may be a material having electrical properties (e.g. resistance, capacitance, etc.) that may be changed through the application of energy such as, for example, heat, light, voltage potential, or electrical current. Examples of a phase change material may include a chalcogenide material.

A chalcogenide alloy may be used in a memory element or in an electronic switch. A chalcogenide material may be a material that includes at least one element from column VI of the periodic table or may be a material that includes one or more of the chalcogen elements, e.g., any of the elements of tellurium, sulfur, or selenium.

Memory 100 may include column lines 141–143 and row lines 151–153 to select a particular memory cell of the array during a write or read operation. Column lines 141–143 and row lines 151–153 may also be referred to as address lines since these lines may be used to address memory cells 111–119 during programming or reading. Column lines 141–143 may also be referred to as bit lines and row lines 151–153 may also be referred to as word lines.

Memory elements 130 may be connected to row lines 151–153 and may be coupled to column lines 141–143 via select device 120. While one select device 120 is depicted, more select devices may also be used. Therefore, when a particular memory cell (e.g., memory cell 115) is selected, voltage potentials may be applied to the memory cell's associated column line (e.g., 142) and row line (e.g., 152) to apply a voltage potential across the memory cell.

Series connected select device 120 may be used to access memory element 130 during programming or reading of memory element 130. A select device is an ovonic threshold switch that can be made of a chalcogenide alloy that does not exhibit an amorphous to crystalline phase change and which undergoes rapid, electric field initiated change in electrical conductivity that persists only so long as a holding voltage is present. Select device 120 may operate as a switch that is either "off" or "on" depending on the amount of voltage potential applied across the memory cell, and more particularly whether the current through the select device exceeds its threshold current or voltage, which then triggers the device into the on state. The off state may be a substantially electrically nonconductive state and the on state may be a substantially conductive state, with less resistance than the off state. In the on state, the voltage across the select device is equal to its holding voltage $V_H$ plus I×Ron, where Ron is the dynamic on resistance and I is the current through the select device. For example, select device 120 may have threshold voltages and, if a voltage potential less than the threshold voltage of a select device 120 is applied across select device 120, then at least one select device 120 may remain "off" or in a relatively high resistive state so that little or no electrical current passes through the memory cell and most of the voltage drop from selected row to selected column is across the select device. Alternatively, if a voltage potential greater than the threshold voltages of select device 120 is applied across select device 120, then the select device 120 may "turn on," i.e., operate in a relatively low resistive state so that electrical current passes through the memory cell. In other words, select device 120 may be in a substantially electrically nonconductive state if less than a predetermined voltage potential, e.g., the threshold voltage, is applied across select device 120. Select device 120 may be in a substantially conductive state if greater than the predetermined voltage potential is applied across select device 120. Select device 120 may also be referred to as an access device, an isolation device, or a switch.

In one embodiment, each select device 120 may comprise a switching material such as, for example, a chalcogenide alloy, and may be referred to as an ovonic threshold switch, or simply an ovonic switch. The switching material of select device 120 may be a material in a substantially amorphous state positioned between two electrodes that may be repeatedly and reversibly switched between a higher resistance "off" state (e.g., greater than about ten megaOhms) and a relatively lower resistance "on" state (e.g., about one hundred Ohms in series with $V_H$) by application of a predetermined electrical current or voltage potential. In this embodiment, each select device 120 may be a two terminal device that may have a current-voltage (I-V) characteristic similar to a phase change memory element that is in the amorphous state. However, unlike a phase change memory element, the switching material of select device 120 may not change phase. That is, the switching material of select device 120 may not be a programmable material, and, as a result, select device 120 may not be a memory device capable of storing information. For example, the switching material of select device 120 may remain permanently amorphous and the I-V characteristic may remain the same throughout the operating life. A representative example of I-V characteristics of select device 120 is shown in FIG. 2.

Figure 2:
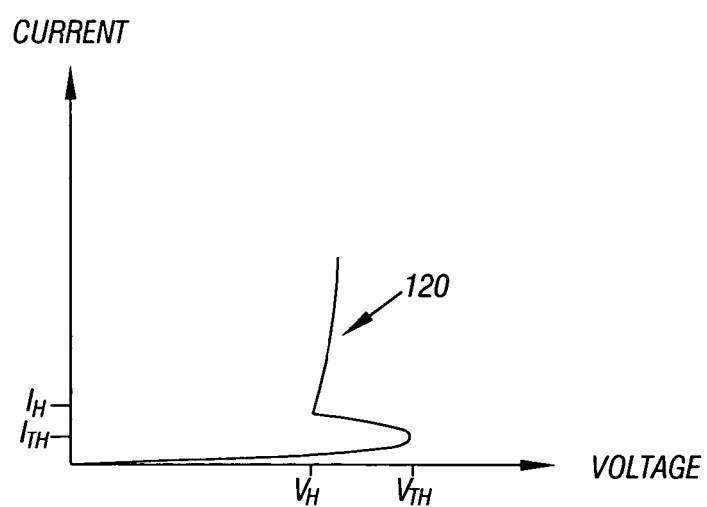
FIG. 2 is a diagram illustrating a current-voltage characteristic of an access device.

Turning to FIG. 2, in the low voltage or low electric field mode, i.e., where the voltage applied across select device 120 is less than a threshold voltage (labeled $V_{TH}$), select device 120 may be "off" or nonconducting, and exhibit a relatively high resistance, e.g., greater than about 10 megaOhms. Select device 120 may remain in the off state until a sufficient voltage, e.g., $V_{TH}$, is applied, or a sufficient current is applied, e.g., $I_{TH}$, that may switch select device 120 to a conductive, relatively low resistance on state. After a voltage potential of greater than about $V_{TH}$ is applied across select device 120, the voltage potential across select device 120 may drop ("snapback") to a holding voltage potential, labeled $V_H$. Snapback may refer to the voltage difference between $V_{TH}$ and $V_H$ of a select device.

In the on state, the voltage potential across select device 120 may remain close to the holding voltage of $V_H$ as current passing through select device 120 is increased. Select device 120 may remain on until the current through select device 120 drops below a holding current, labeled $I_H$. Below this value, select device 120 may turn off and return to a relatively high resistance, nonconductive off state until the $V_{TH}$ and $I_{TH}$ are exceeded again.

Figure 3:
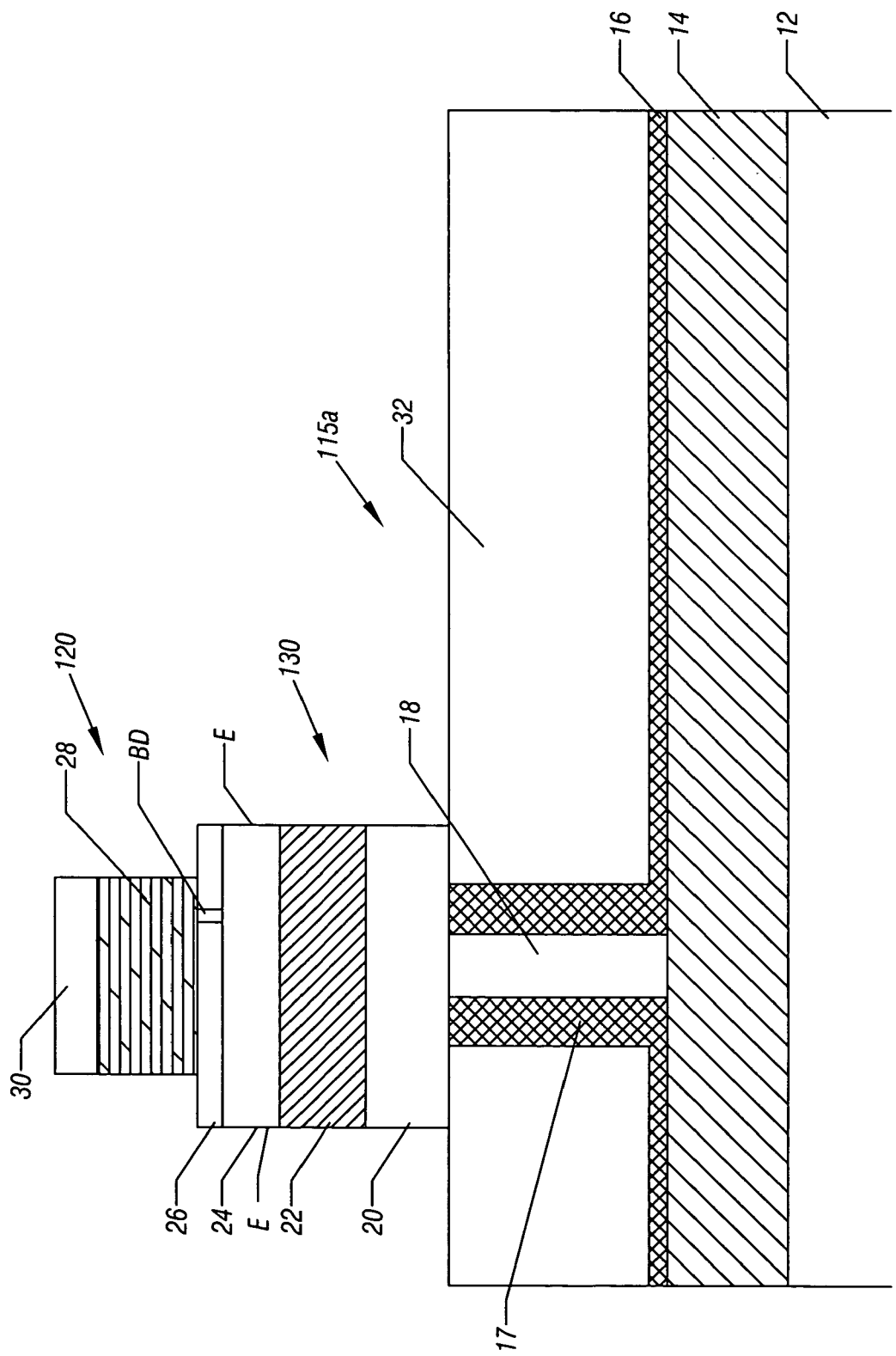
FIG. 3 is a cross-sectional view of a portion of the memory illustrated in FIG. 1 in accordance with an embodiment of the present invention.

Turning to FIG. 3, an embodiment of a particular memory cell 115a of memory 100 is arranged in a vertical stack in one embodiment of the present invention. However, other configurations may also be used including configurations in which the order of the devices is changed, and including configurations with two or three discrete stacks wired in series. Memory cell 115a may comprise substrate 12 and conductive material 14 overlying the substrate 240. The conductive material 14 may be an address line (e.g., row line 152). An insulator 16 may be formed over the material 14 and under an insulator 32. Formed in a pore through the insulator 32 is a spacer 17 and an electrode or lance 18. Over the insulator 32 and lance 18 is a switching material 20, such as a programmable chalcogenide, a barrier film electrode 22, a switching material 24, such as a non-programmable chalcogenide (may be called an ovonic switching material), a breakdown layer 26, a conductive material 28, and a hard mask 30 may be deposited to form a vertical memory cell structure. The conductive material 28 may be an address line (e.g., column line 142).

The substrate 12 may be, for example, a semiconductor substrate (e.g., a silicon substrate), although the scope of the present invention is not limited in this respect. Other suitable substrates may be, but are not limited to, substrates that contain ceramic material, organic material, or a glass material.

Barrier film electrode 22 may be, for example, titanium aluminum nitride or a composite barrier film.

An insulator 32 may be formed using, for example, a PECVD (Plasma Enhanced Chemical Vapor Deposition) process, HDP (High Density Plasma) process, or spin-on and bake sol gel process. Insulator 32 may be a dielectric material that may be a thermally and/or electrically insulating material such as, for example, silicon dioxide, although the scope of the present invention is not limited in this respect. Insulator 32 may have a thickness ranging from about 100 Å to about 4000 Å, although the scope of the present invention is not limited in this respect. In one embodiment, the thickness of insulator 32 may range from about 500 Å to about 2500 Å.

Although the scope of the present invention is not limited in this respect, insulator 32 may be planarized using a chemical or CMP technique.

Switching material 20 may be a phase change, programmable material capable of being programmed into one of at least two memory states by applying a current to switching material 20 to alter the phase of switching material 20 between a substantially crystalline state and a substantially amorphous state, wherein a resistance of switching material 20 in the substantially amorphous state is greater than the resistance of switching material 20 in the substantially crystalline state.

Programming of switching material 20 to alter the state or phase of the material may be accomplished by applying voltage potentials to conductive materials 14 and 28, thereby generating a voltage potential across select device 120 and memory element 130. When the voltage potential is greater than the threshold voltage of select device 120 and memory element 130, then an electrical current may flow through memory material 20 in response to the applied voltage potential, and may result in heating of memory material 20.

This heating may alter the memory state or phase of memory material 20. Altering the phase or state of memory material 20 may alter the electrical characteristic of memory material 20, e.g., the resistance of the material may be altered by altering the phase of the memory material 20. Memory material 20 may also be referred to as a programmable resistive material.

In the "reset" state, memory material 20 may be in an amorphous or semi-amorphous state and in the "set" state, memory material 20 may be in an a crystalline or semi-crystalline state. The resistance of memory material 20 in the amorphous or semi-amorphous state may be greater than the resistance of memory material 20 in the crystalline or semi-crystalline state. It is to be appreciated that the association of reset and set with amorphous and crystalline states, respectively, is a convention and that at least an opposite convention may be adopted.

Using electrical current, memory material 20 may be heated to a relatively higher temperature to amorphosize memory material 20 and "reset" memory material 20 (e.g., program memory material 20 to a logic "0" value). Heating the volume of memory material 20 to a relatively lower crystallization temperature may crystallize memory material 20 and "set" memory material 20 (e.g., program memory material 20 to a logic "1" value). Various resistances of memory material 20 may be achieved to store information by varying the amount of current flow and duration through the volume of memory material 20.

Although the scope of the present invention is not limited in this respect, lance 18 may be titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 20.

Although the scope of the present invention is not limited in this respect, in one example, the composition of ovonic switching material 24 may comprise a Si concentration of about 14%, a Te concentration of about 39%, an As concentration of about 37%, a Ge concentration of about 9%, and an In concentration of about 1%. In another example, the composition of switching material 24 may comprise a Si concentration of about 14%, a Te concentration of about 39%, an As concentration of about 37%, a Ge concentration of about 9%, and a P concentration of about 1%. In these examples, the percentages are atomic percentages which total 100% of the atoms of the constituent elements.

In another embodiment, a composition for switching material 24 may include an alloy of arsenic (As), tellurium (Te), sulfur (S), germanium (Ge), selenium (Se), and antimony (Sb) with respective atomic percentages of 10%, 21%, 2%, 15%, 50%, and 2%.

Although the scope of the present invention is not limited in this respect, in other embodiments, switching material 24 may include Si, Te, As, Ge, sulfur (S), and selenium (Se). As an example, the composition of switching material 940 may comprise a Si concentration of about 5%, a Te concentration of about 34%, an As concentration of about 28%, a Ge concentration of about 11%, a S concentration of about 21%, and a Se concentration of about 1%.

Conductive material 28 may be a thin film material having a thickness ranging from about 20 Å to about 2000 Å. In one embodiment, the thickness of the material 28 may range from about 100 Å to about 1000 Å. In another embodiment, the thickness of the material 28 may be about 300 Å. Suitable materials may include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 24.

The breakdown layer 26 defines an avenue for electrical conduction. The layer 26 is of a material which breaks down when a potential is applied via the materials 14 and 28, forming a conduction breakdown filament "BD," shown in FIG. 3.

To a first order, the threshold current of the memory device 130 is proportional to the area of the smaller of the conductive material 28 and electrode 22 in contact with the switching material 24. By making the breakdown layer 26 of a dielectric, the effective area of the conductive material 28 is significantly reduced to the area of the breakdown filament BD. When the device 120 is used in series with an element 130, it is desirable that the threshold current of the device 120 is less than the threshold current of the memory element 130. The presence of the breakdown layer 26 may also reduce the leakage current of unselected devices 120 and 130 because of the reduction of the intersection area between the material 28 and the switching material 24.

In one embodiment, the lateral extent of the breakdown layer 26, the switching material 24, and the electrode 22 is patterned to be larger than the lateral extent of the material 28 by means of a partial stack etch of layers 30 and 28, stopping on layer 26 and then a separate re-patterning of the remaining layers 26, 24, 22 and 20. As a result, the location of the breakdown filament BD is further away from the etched edge E of the layer 24. An alternative embodiment is to etch all the layers 30, 28, 26, 24, 22, and 20 in a single lithography etch step. One of the concerns with this approach is that now the BD physical location may be at the edge of layer 24, potentially leading to a higher degree of variability in the IV characteristics of the access device 120.

The material for the breakdown layer 26 may be chosen to improve the adhesion of the stack. For example, when a non-reactive material is used for the material 28, such as ruthenium or platinum, the dielectric used as the breakdown layer 26 may improve adhesion to the material 28. In some embodiments, the breakdown layer 26 may be $Al_2O_3$ which may have good adhesion between the device 120 and an inert or non-reactive material 28. However, any dielectric may be utilized for the breakdown layer 26, including an oxide layer. Because of the difference in sizes of the material 28 versus the switching material 24, the breakdown filament BD is further away from the etched edge E.

Figure 4:
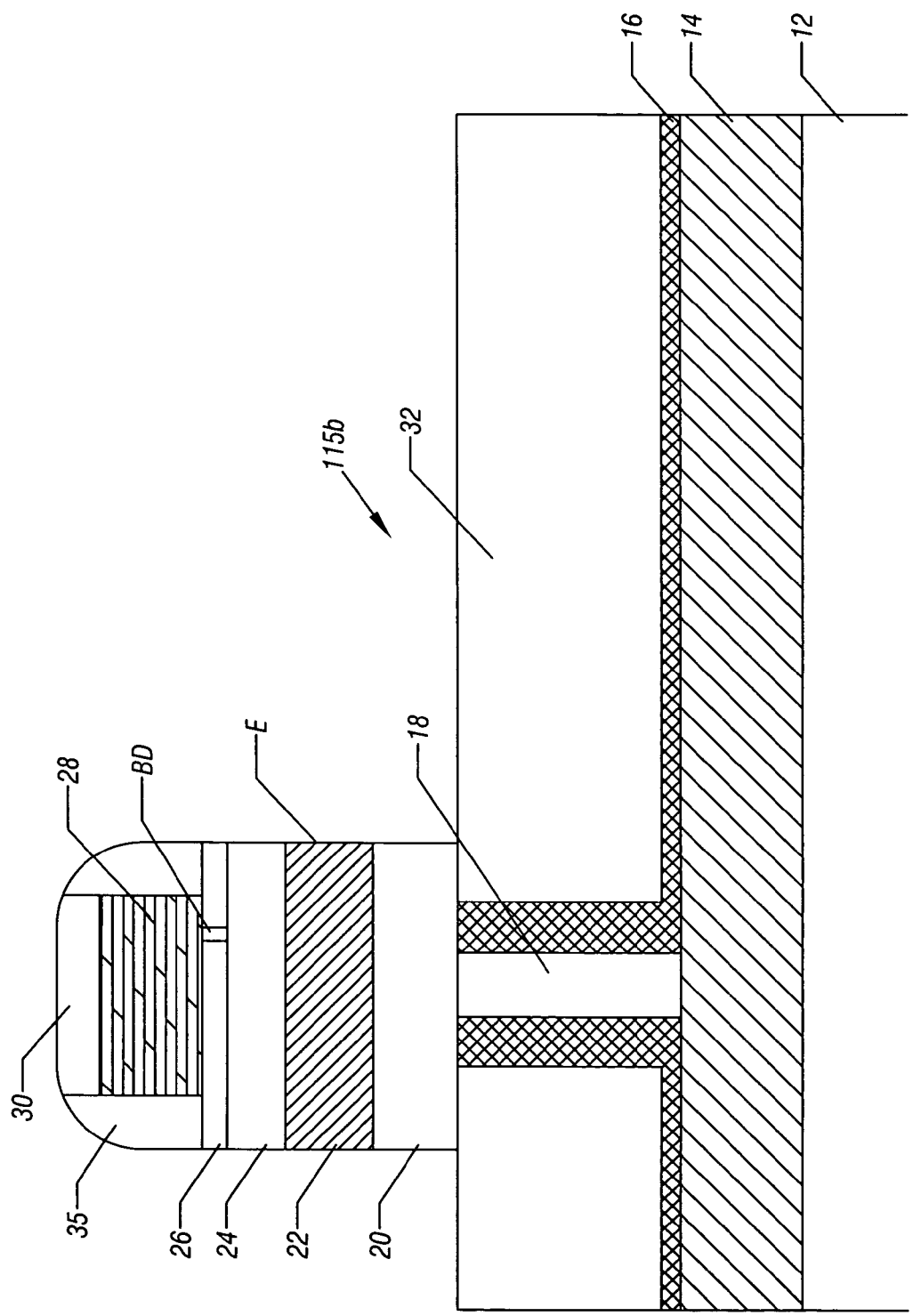
FIG. 4 is a cross-sectional view of a portion of the memory illustrated in FIG. 1 in accordance with an embodiment of the present invention.

In FIG. 4, the layers underneath the breakdown layer 26 may be the same as in FIG. 3, but the breakdown layer 26 and electrode 24 is made larger than the conducting material 28, that serves as the top electrode, by virtue of the presence of insulating sidewall spacers 35. The use of spacers 35 moves the breakdown filament BD further from the etched edge E because of the increased width of the conducting material 24. The spacers 35 may be formed of low temperature nitride (LTN) in one embodiment of the present invention. They may be applied as a coating and then anisotropically etched to form the sidewall spacers 35.

Thus, the resulting cell 115b may have reduced leakage by moving the breakdown filament BD of the threshold device 120 inside of the etched edge E of the device 120.

One advantage of the structure shown in FIG. 4 is that only a single lithography operation may be used to define all the layers of the stack. Lithography may be used to define layers 30 and 28 stopping the etch on layer 26. Then photoresist removal may be followed by insulating spacer 35 deposition and formation followed by etching of layers 26, 24, 22 and 20 using the spacer 35 as a etch hard mask to define the etched edge E of layers 26, 24, 22 and 20.

Figure 5:
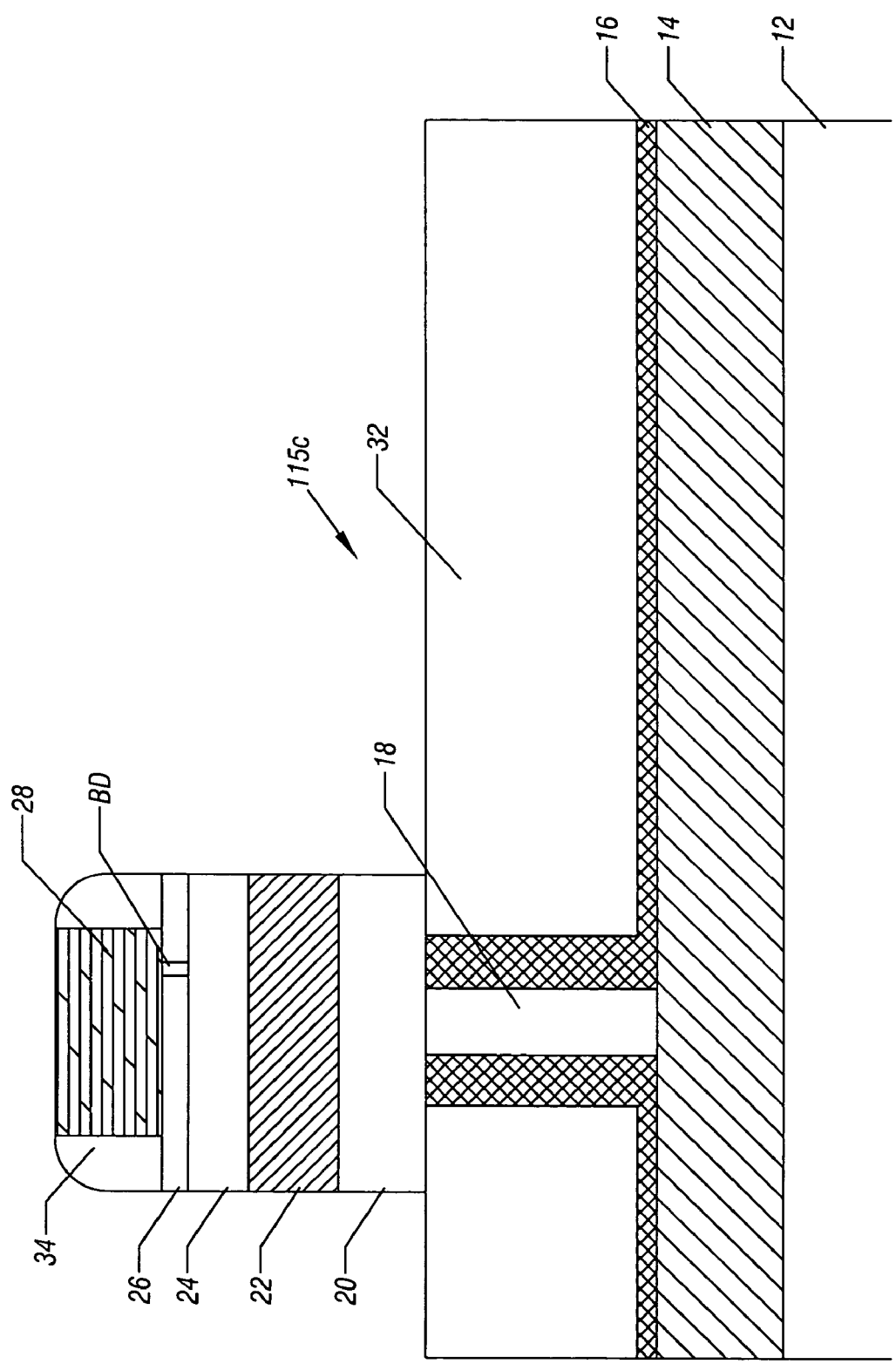
FIG. 5 is a cross-sectional view of a portion of the memory illustrated in FIG. 1 in accordance with an embodiment of the present invention.

FIG. 5 corresponds to FIG. 4 with the hard mask 30 omitted or removed.

Figure 6:
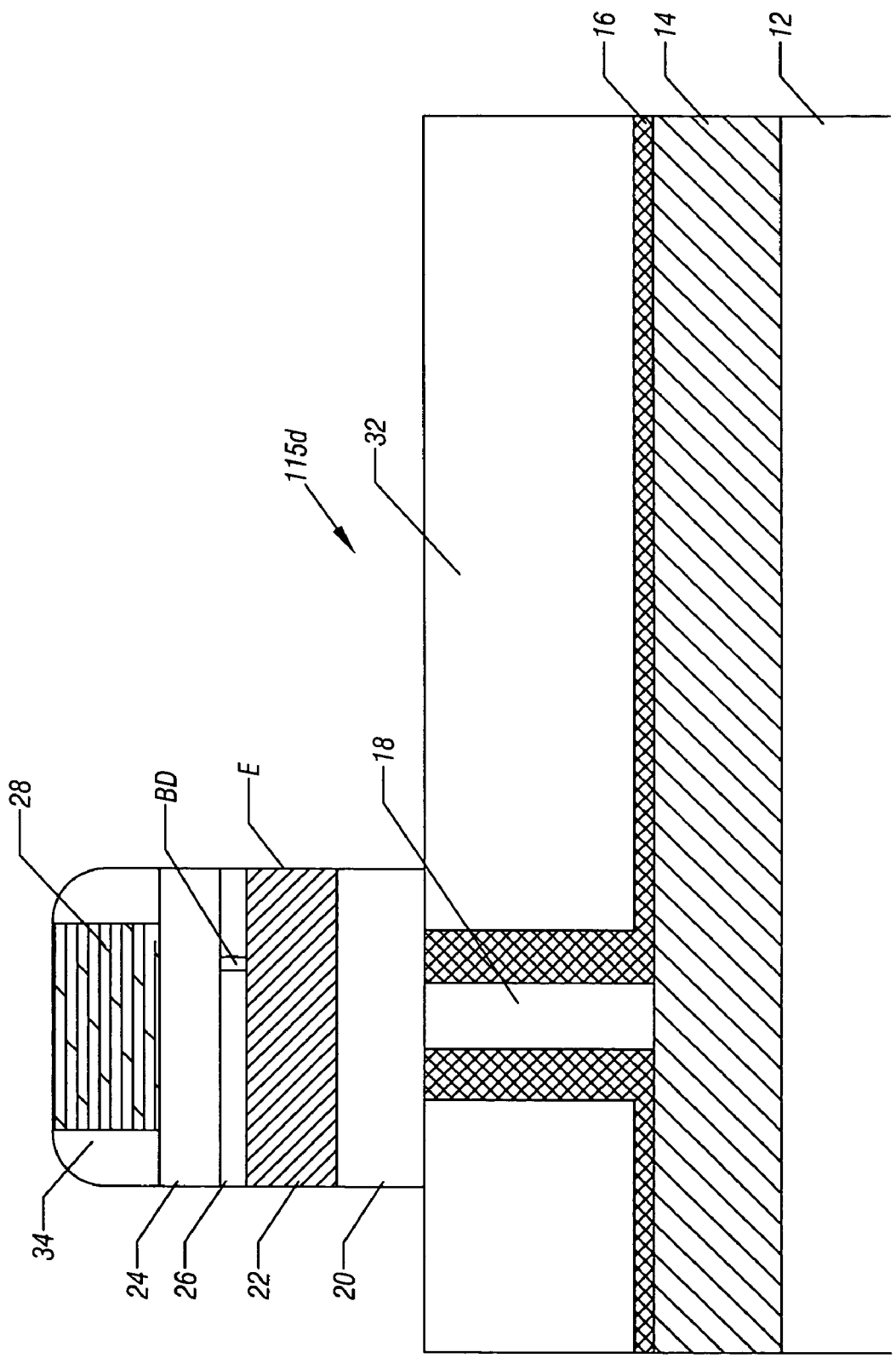
FIG. 6 is a cross-sectional view of a portion of the memory illustrated in FIG. 1 in accordance with an embodiment of the present invention.

Referring to FIG. 6, the structure depicted is similar to the structure of FIG. 4 except that the breakdown layer 26 has now been moved below the switching material 24, instead of above it. Again, this in this position of the layer 26, the breakdown filament BD is still moved away from the etched edge E of the device 120 due to edge of the top electrode material 28 being inside layers 24 and 26.

Figure 7:
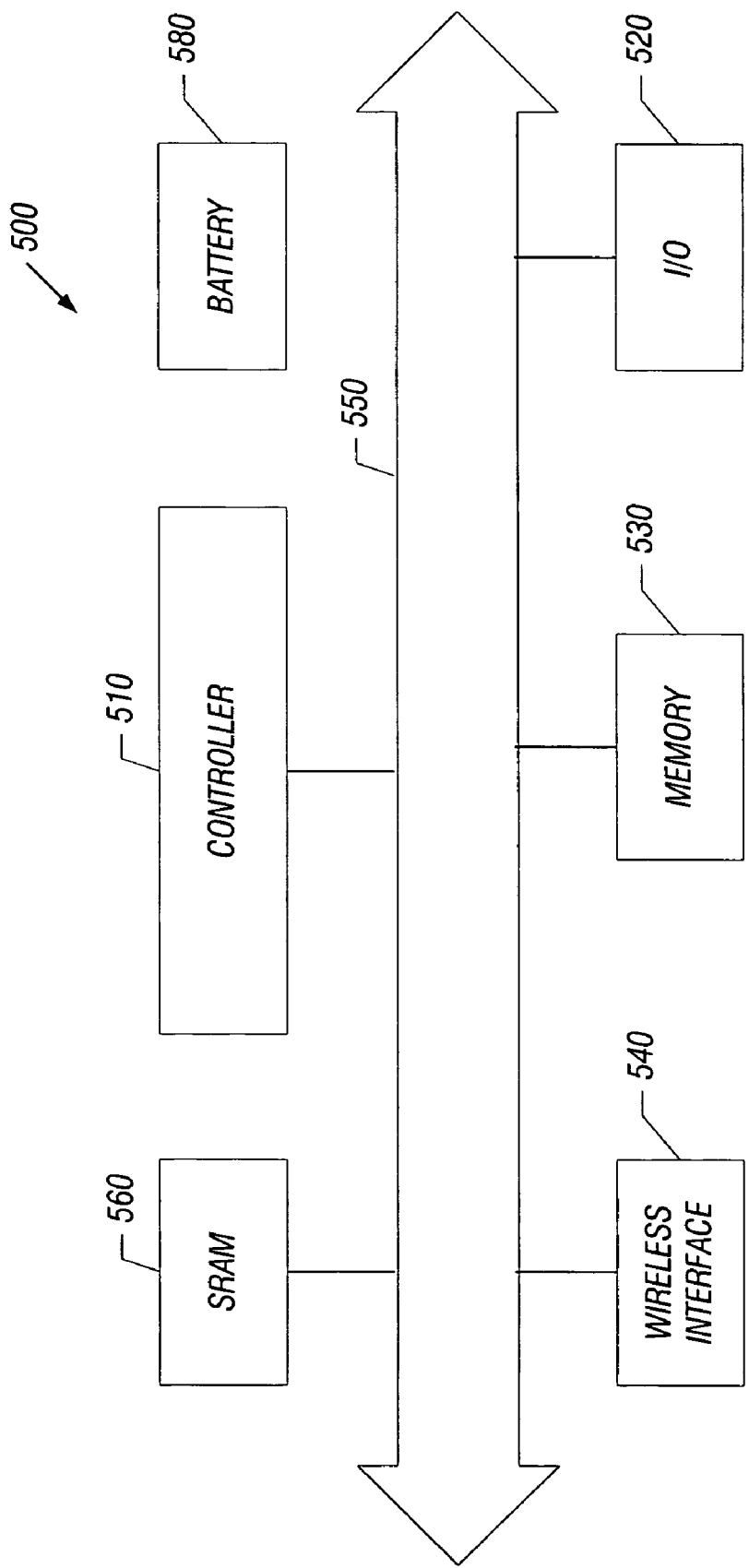
FIG. 7 is a block diagram illustrating a portion of a system in accordance with an embodiment of the present invention.

Turning to FIG. 7, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 860, and may be used to store user data. Memory 875 may be provided by one or more different types of memory. For example, memory 530 may comprise any type of random access memory, a volatile memory, a non-volatile memory such as a flash memory and/or a memory such as memory 100 discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method comprising:
   providing a phase change memory including a select device and a memory element;
   forming said select device of an upper conductive material, a switching material, and a lower conductive material;
   forming said switching material of a material that is not programmable; and
   providing a dielectric breakdown layer within said select device.

2. The method of claim 1 including forming said breakdown layer between said upper conductive material and said switching material.

3. The method of claim 1 including forming said breakdown layer between said lower conductive material and said switching material.

4. The method of claim 1 including forming said upper conductive material to have a smaller lateral extent than said switching material.

5. The method of claim 4 including providing sidewall spacers on the side of said upper conductive material.

6. The method of claim 1 including forming said breakdown layer of a material that adheres to a layer in contact with said breakdown layer.

7. The method of claim 6 including forming said breakdown layer of $Al_2O_3$.

8. The method of claim 1 including forming a stack including said select device over said memory element.

9. The method of claim 8 including forming said memory element beneath said select device.

10. A phase change memory comprising:
    a phase change memory element including a chalcogenide; and
    a select device for said memory element, said select device including a breakdown layer, wherein said select device includes an upper conductive material, a switching material, and a lower conductive material, and wherein said switching material is not programmable.

11. The memory of claim 10 wherein said breakdown layer is a dielectric.

12. The memory of claim 11 wherein said breakdown layer includes $Al_2O_3$.

13. The memory of claim 10 wherein said switching material is a chalcogenide.

14. The memory of claim 10 wherein said breakdown layer is between said upper conductive material and said switching material.

15. The memory of claim 10 wherein said breakdown layer is between said lower conductive material and said switching material.

16. The memory of claim 10 wherein said upper conductive material has a smaller lateral extent than said switching material.

17. The memory of claim 16 including sidewall spacers on the side of said upper conductive material.

18. The memory of claim 10 wherein said phase change memory element and said select device are formed as a stack having a common etched edge.

19. The memory of claim 18 wherein said memory element is below said select device.

20. The memory of claim 19 wherein said select device includes an upper conductive material, a switching material, and a lower conductive material and said upper conductive material has a smaller lateral extent than said lower conductive material.

21. A system comprising:
    a processor;
    a static random access memory coupled to said processor; and
    a memory including a phase change memory element having a chalcogenide and a select device for said memory element, said select device including a breakdown layer, wherein said select device includes an upper conductive material, a switching material, and a lower conductive material and said upper conductive material has a smaller lateral extent than said lower conductive material.

22. The system of claim 21 wherein said breakdown layer is a dielectric.

23. The system of claim 21 wherein said breakdown layer includes $Al_2O_3$.

24. The system of claim 21 wherein said select device includes a chalcogenide material.

25. The system of claim 21 including sidewall spacers on said upper conductive material.

26. A phase change memory comprising:
    a phase change memory element including a chalcogenide; and
    a select device for said memory element, said select device including a breakdown layer, wherein said select device includes an upper conductive material, a switching material, and a lower conductive material and said upper conductive material has a smaller lateral extent than said switching material.

27. The memory of claim 26 wherein said breakdown layer is a dielectric.

28. The memory of claim 27 wherein said breakdown layer includes $Al_2O_3$.

29. The memory of claim 26 wherein said switching material is not programmable.

30. The memory of claim 29 wherein said switching material is a chalcogenide.

31. The memory of claim 26 wherein said breakdown layer is between said upper conductive material and said switching material.

32. The memory of claim 26 wherein said breakdown layer is between said lower conductive material and said switching material.

33. The memory of claim 26 including sidewall spacers on the side of said upper conductive material.

34. The memory of claim 26 wherein said phase change memory element and said select device are formed as a stack having a common etched edge.

35. The memory of claim 32 wherein said memory element is below said select device.

36. The memory of claim 35 wherein said select device includes an upper conductive material, a switching material, and a lower conductive material and said upper conductive material has a smaller lateral extent than said lower conductive material.

* * * * *